(12) United States Patent
Tsang et al.

(10) Patent No.: US 7,741,980 B2
(45) Date of Patent: Jun. 22, 2010

(54) PROVIDING RUNNING DIGITAL SUM CONTROL IN A PRECODED BIT STREAM USING PRECODER AWARE ENCODING

(75) Inventors: Kinhing Paul Tsang, Plymouth, MN (US); Cenk Argon, Chapel Hill, NC (US)

(73) Assignee: Seagate Technology LLC, Scotts Valley, CA (US)

( * ) Notice: Subject to any disclaimer, the term of this patent is extended or adjusted under 35 U.S.C. 154(b) by 29 days.

(21) Appl. No.: 12/203,555

(22) Filed: Sep. 3, 2008

(65) Prior Publication Data

US 2010/0052953 A1    Mar. 4, 2010

(51) Int. Cl.
*H03M 5/00* (2006.01)
(52) U.S. Cl. .......................................... 341/58; 341/94
(58) Field of Classification Search ............... 341/81, 341/59, 58, 61, 94; 714/755, 769, 786, 802
See application file for complete search history.

(56) References Cited

U.S. PATENT DOCUMENTS

| | | | |
|---|---|---|---|
| 4,408,189 A | 10/1983 | Betts et al. | |
| 5,270,714 A | 12/1993 | Tanaka et al. | |
| 5,422,597 A | 6/1995 | Stengel et al. | |
| 5,784,409 A | 7/1998 | Coles | |
| 5,910,969 A | 6/1999 | Sayiner et al. | |
| 6,664,905 B1 | 12/2003 | Coene | |
| 6,731,228 B2 | 5/2004 | Suh et al. | |
| 6,909,385 B2 | 6/2005 | Vasic et al. | |
| 6,989,776 B2 * | 1/2006 | Tsang | ........................ 341/59 |
| 7,002,492 B2 | 2/2006 | Tsang et al. | |
| 7,088,268 B2 | 8/2006 | Tsang | |
| 7,203,884 B2 | 4/2007 | Dati et al. | |
| 7,430,706 B1 * | 9/2008 | Yuan et al. | .................. 714/807 |
| 7,555,694 B2 * | 6/2009 | Kyung et al. | ................. 714/755 |
| 2007/0067509 A1 | 3/2007 | Kuijper et al. | |

* cited by examiner

*Primary Examiner*—Brian Young
(74) *Attorney, Agent, or Firm*—Leanne Taveggia Farrell; Westman, Champlin & Kelly, P.A.

(57) ABSTRACT

A system includes a precoder-aware running digital sum (RDS) encoder that encodes user data as w-bit sub-blocks, to produce an encoded data block that meets block RDS constraints and consists of encoded data sub-blocks that meet sub-block RDS constraints. The sub-block constraints include the data sub-blocks having the same magnitude RDS before and after precoding. The encoder data block is further encoded using an error correction code to produce parity bits, and the parity bits are dispersed, as i-bit parity sub-blocks, between selected data sub-blocks to form a code word. The code word is then precoded to produce a precoded bit sequence for transmission over a channel. Sub-block run length limit ("RLL") constraints may also be included, such that the encoded data block meets both RLL and RDS, with the encoded data sub-blocks meeting respective RLL and RDS sub-block constraints.

18 Claims, 9 Drawing Sheets

PROVIDING RUNNING DIGITAL SUM CONTROL IN A PRECODED BIT STREAM USING PRECODER AWARE ENCODING

BACKGROUND

The invention relates generally to encoding using codes that satisfy run-digital-sum constraints.

Before recording or transmission, data are typically encoded for error protection and also for modulation, to preserve signal content against corruption by noise, fading and other interference associated with a communications channel in the recording or transmission system. The modulation encoding is also performed to preserve signal content that might otherwise be filtered out by circuitry in the communications channel. For example, a preamplifier in the circuitry acts essentially as a high pass filter, and filters out much of the low frequency content of the information signal. In certain recording systems, such as, for example, perpendicular recording systems, there is significant energy in the low frequency portion of the information signal. Accordingly, the filtering out of the low frequency content would result in performance degradation. The data are thus encoded to preserve the information in the low frequency content. One example of encoding to preserve the information in the low frequency content is running-digital-sum ("RDS") encoding, which constrains the direct-current ("DC") content of the signal to be transmitted (or recorded). Constraining the DC content of the transmission signal essentially means shifting the low frequency content of the information signal to a higher frequency spectrum so that the information in the low frequency content of the original data signal does not get filtered out at the receiving end.

Typically, the user data are encoded to produce RDS encoded data and the RDS encoded data are further encoded using an error correction code (ECC) to produce error correction code words. The ECC can be a traditional Reed-Solomon (RS) code, an iterative code like a low-density parity-check (LDPC) code, a combination or concatenation of the RS and LDPC codes or, in general, any block or convolutional code or combinations or concatenations thereof.

Before entering the communications channel, the RDS and ECC encoded data and the parity bits are provided to a precoder, which translates them into bit sequences that are optimized for transmission and detection. The precoding, however, essentially disrupts the RDS constraints, and there is thus a trade-off between the optimization for transmission/detection and the encoding to preserve signal content through the channel circuitry.

Further, certain bit patterns, for example, long runs without transitions, may adversely affect timing recovery, while other patterns may affect signal to noise ratios, and so forth. Accordingly, the modulation codes generally include run length constraints, and are often also referred to as run length limited ("RLL") codes.

High rate codes, that is, codes that produce a code word with a small increase in overall bit count, are desirable for their efficiency. To avoid adversely affecting the rate of transmission, it is desirable to encode long data sequences with high rate codes. However, there is a trade off between efficiency and the complexities associated with manipulating the large sequence of data bits into correspondingly wide code words. Further, code complexities may increase when run length constraints must be considered. A system that efficiently encodes data using a high rate RLL code is described in U.S. Pat. No. 6,839,044, which is hereby incorporated herein in its entirety by reference.

SUMMARY

A system includes a precoder-aware running digital sum (RDS) encoder that encodes user data as w-bit sub-blocks, to produce an encoded data block that meets block RDS constraints and consists of encoded data sub-blocks that meet sub-block RDS constraints. The sub-block constraints include the data sub-blocks having the same magnitude RDS before and after precoding. The encoder data block is further encoded using an error correction code to produce parity bits, and the parity bits are dispersed, as i-bit parity sub-blocks, between selected data sub-blocks to form a code word. The code word is then precoded to produce a precoded bit sequence for transmission over a channel.

Sub-block run length limit ("RLL") constraints may also be included, such that the encoded data block meets both RLL and RDS, with the encoded data sub-blocks meeting respective RLL and RDS sub-block constraints.

BRIEF DESCRIPTION OF THE DRAWINGS

The invention description below refers to the accompanying drawings, of which.

DETAILED DESCRIPTION OF AN ILLUSTRATIVE EMBODIMENT

Figure 5:
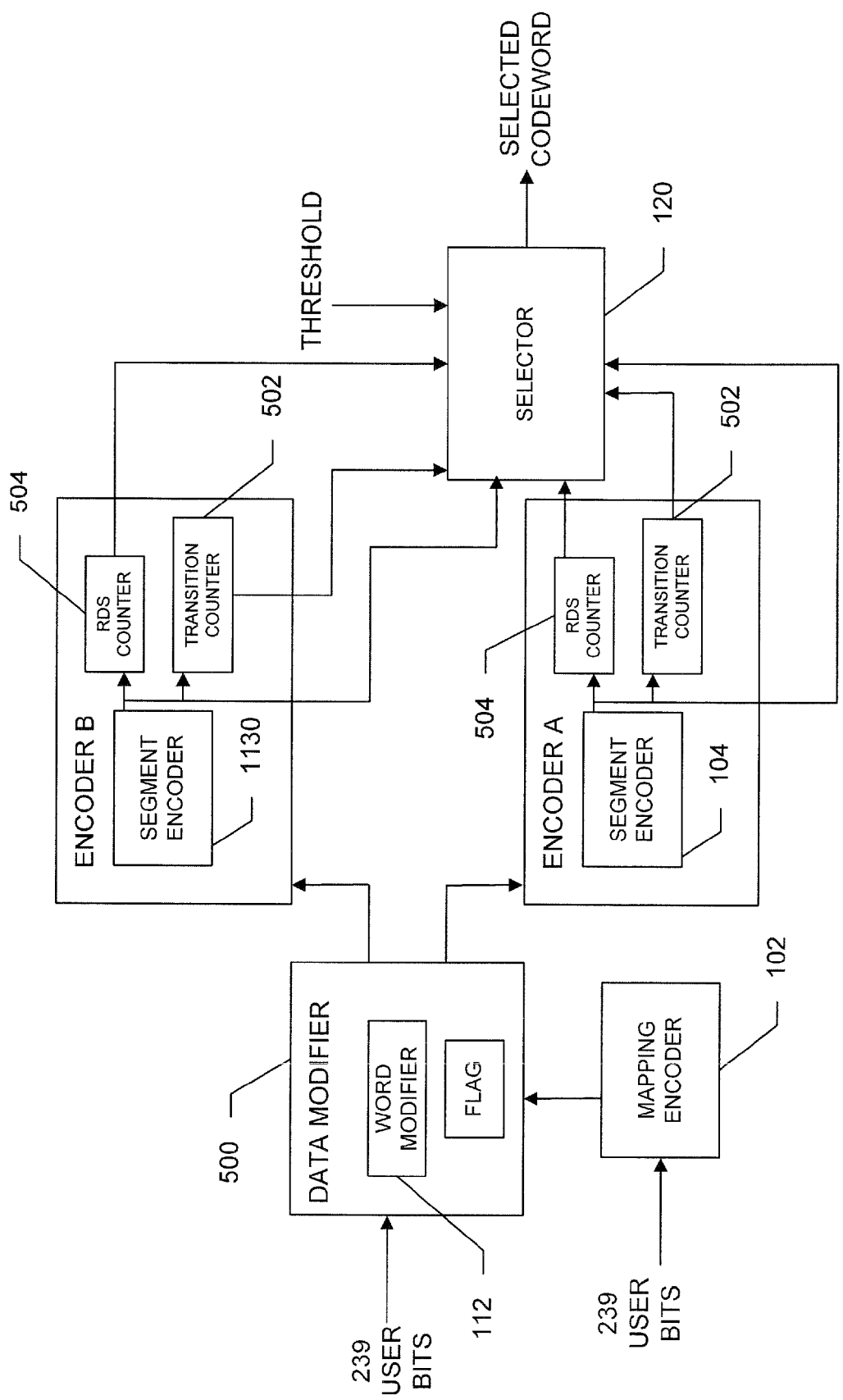
FIG. 5 is a functional block diagram of an alternative embodiment of the encoder of FIG. 1.
Figure 6:
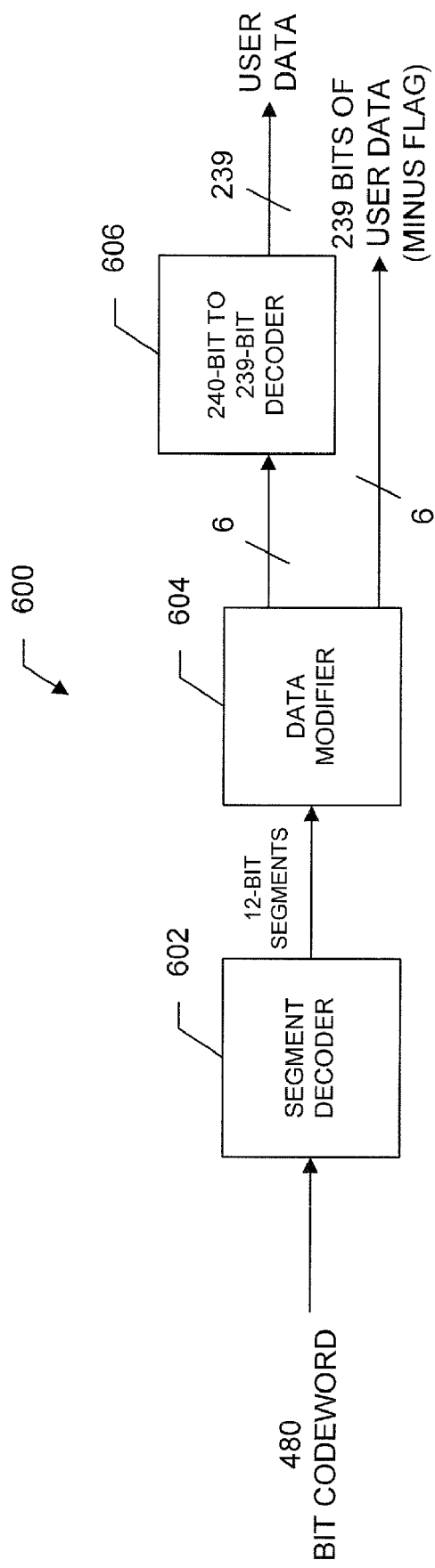
FIG. 6 is a functional block diagram of a decoding system.
Figure 7:
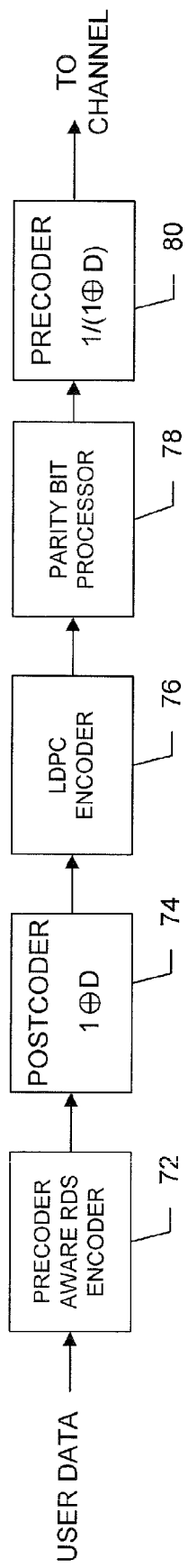
FIG. 7 is a functional block diagram of an encoding system that includes a precoder aware running-digital-sum encoder.
Figure 8:
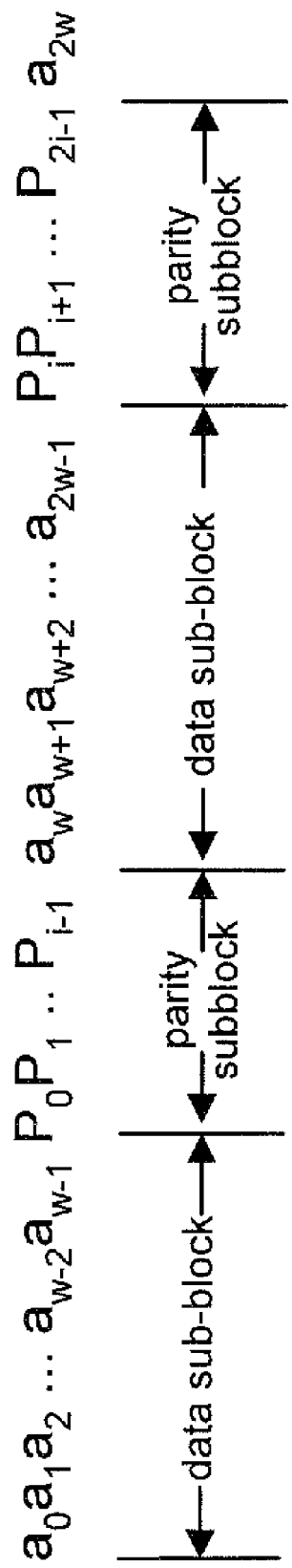
FIG. 8 illustrates a code word block after encoding.
Figure 9:
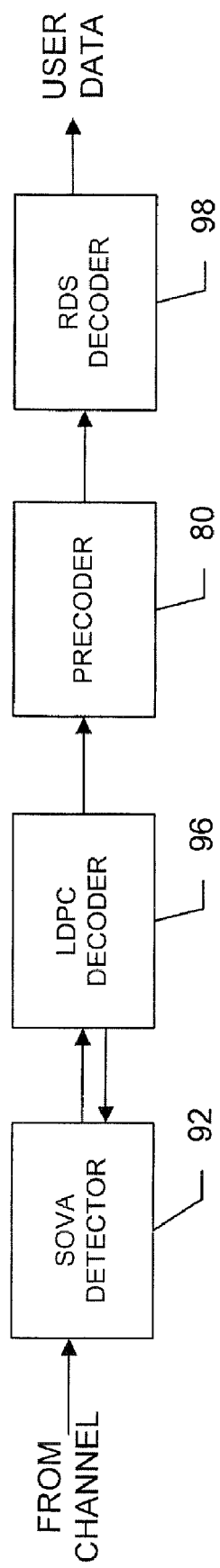
FIG. 9 is a functional block diagram of a decoding system for use with the encoding system of FIG. 7.

We discuss encoding for running digital-sum ("RDS") and run length limit ("RLL") control with reference to FIGS. 1-6, and an encoding system that includes a precoder aware running digital sum ("RDS") encoder with reference to FIGS. 7-9.

Figure 1:
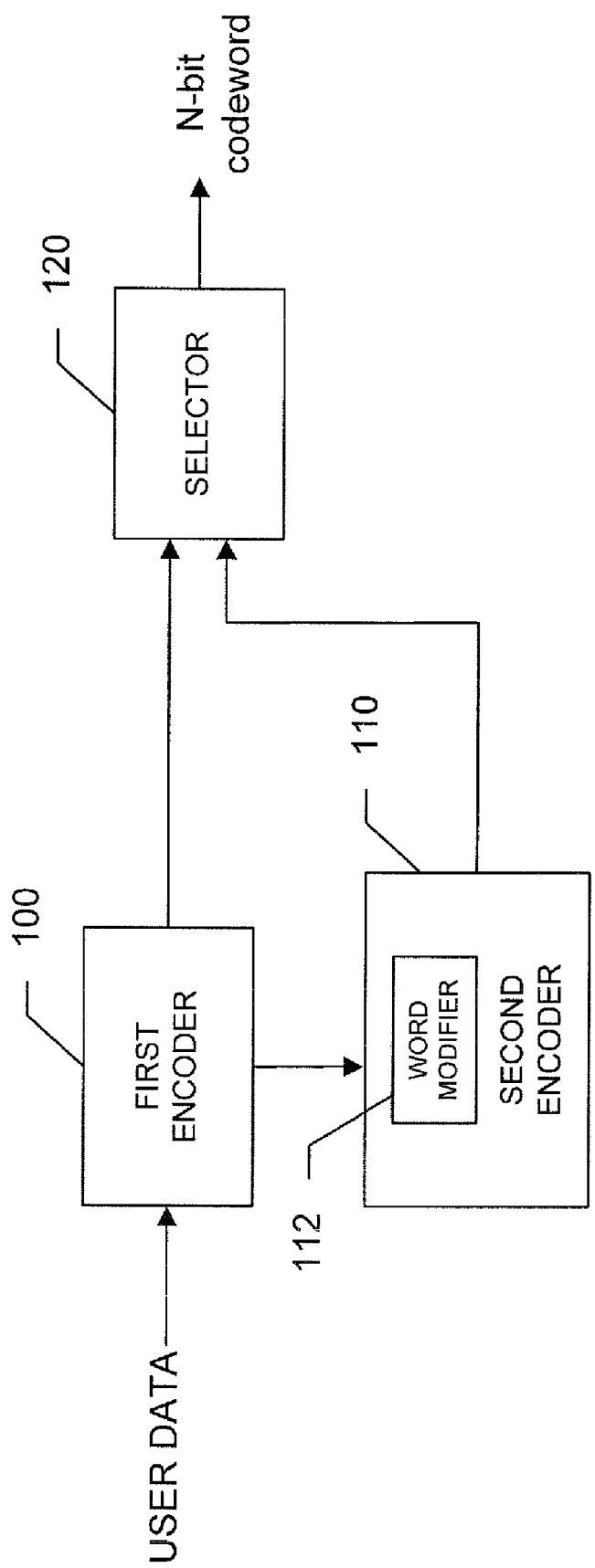
FIG. 1 is a functional block diagram of an encoding system.

Referring now to FIG. 1, a first encoder 100 encodes (N-y-1) data bits into m n-bit patterns in accordance with a modulation code that meets maximum run length constraints of "j" for consecutive runs of transitions and "k" for consecutive runs with no transmissions, and an RDS threshold of "r." The encoder 100 encodes the (N-y)-1 data bits and y flag bits by producing m n-bit segments, or words, and encoding the n-bit words to produce first n-bit patterns. The first code word consists of the m first n-bit patterns.

There are particular n-bit patterns that cannot be used in the N-bit code word because of the run length constraints and the RDS threshold. For example, n-bit patterns with relatively high |RDS| values and any n-bit patterns that exceed the run length limits of k and j can be eliminated. Thus "v" n-bit patterns are eliminated, and the remaining n-bit patterns may be utilized for the encoding.

The flag bits are included in the first n-bit segment to be encoded, and are set to a first predetermined state, for example, all zeros, for inclusion in the first code word. As discussed in more detail below, the flag bits are set during encoding and used for decoding. In the example, we will use a single flag for ease of explanation. However, multiple flags may be used, as is also discussed in more detail below.

A second encoder 110 encodes the (N-y)-1 data bits and y flag bits, which are set to a second predetermined pattern, in the example, to 1, to produce a second code word. The second codeword consists of m second n-bit patterns, with each second n-bit pattern being a companion pattern to the corresponding n-bit pattern in the first code word. The companion n-bit patterns are such that the sum of the |RDS| of a given n-bit pattern and the |RDS| of its companion is less than or equal to a predetermined value "t." The value of t selected to ensure that at least one of the two N-bit code words has an |RDS| value that is less than ($\frac{1}{2}$)*(m*t), where "*" represents multiplication.

In the example, the second encoder 110 modifies the (N-y)-1 data bits in a word modifier 112 and encodes the modified data bits together with the flag bit, which is set to 1. The second encoder subjects the modified bits to the same encoding used in the first encoder, and produces the second N-bit code word. Alternatively, the second encoder may produce the second N-bit code word using a different encoding than is used in the first encoder, with or without first modifying the data bits.

A selector 120 selects which of the first and second N-bit code words best meets the selection criteria. In the example, the selector 120 determines if either or both code words have |RDS| values greater than a threshold S, which may be user programmable. If either or both code words exceed the threshold, the selector 120 selects the code word with the smaller |RDS| value. If both code words have |RDS| values that fall below the threshold, the selector selects the code word with a smaller transition count. Other selection criteria, such as longest or shortest run length, and so forth, may be used instead of or in addition to the |RDS| values and the transition count.

With multiple flags, $2^y$-1 different modified versions of the (N-y)-1 data bits may be encoded to produce $2^y$ different code words, and the selector then selects the code word that best meets the selection criteria. Alternatively, the system may use different mappings, different modifiers or combinations of the two to produce the first N-bit code word and the $2^y$-1 code words that each consist of m n-bit patterns that satisfy the companion RDS constraint with respect to the first code word. To meet the selection criteria, the system determines which code words meet the threshold S. If more than one meets the threshold, the system determines which among those meeting the threshold has the fewest transitions. If all fail to meet the threshold, the system selects the code word with the smallest the |RDS| value. Similarly, other selection criteria may be applied to the $2^y$ code words.

Set forth below is an example in which N=480, y=1, m=40 and n=12. The 40 12-bit patterns form a 480-bit code word. The system encodes 479 user bits, which consist of 478 data bits and 1 flag bit, into the 480-bit code word and thus uses an N-1/N code.

There are 4096 possible 12-bit patterns. Undesirable 12-bit patterns, that is, patterns that do not meet RLL constraints and/or an RDS threshold constraint must be eliminated. The constraints are:

1) The leading or trailing 9 bits of each 12-bit code word must not include "000000000" or "111111111,"

2) The leading or trailing 9 bits of each 12-bit code word must not include "101010101" or "010101010," and 3) The |RDS| of each 12-bit pattern must be less than or equal to 8.

There are 64 patterns that do not meet the conditions set forth above, and thus, 4032 12-bit patterns that meet the conditions. In accordance with the teachings of U.S. Pat. No. 6,839,044, which is incorporated herein by reference, the system encodes "p" bit segments into constrained segments that can be combined with 6-bit unconstrained segments to produce 12-bit words that can be mapped to the patterns that meet the three constraints. The code for the 6-bit segments is determined by selecting a value p such that $2^p$ is greater than or equal to 64. In the example, p=6 is selected and a 239/240 code with the added RLL constraint that the respective 6-bit segments can not be all 1's is used to encode 239 of the 479 user bits to form 40 6-bit constrained segments. Each 6-bit constrained segment is then concatenated with 6 of the remaining 240 user bits, to form a 12-bit segment.

The encoding can produce 63*64=4032 different 12-bit segments, which can then be further encoded into or mapped one-to-one to the 4032 12-bit patterns that meet the run length and RDS constraints.

The second encoder takes the 40 12-bit segments and modifies them by, in the example, combining each of them with a term or, as appropriate, one of a number of terms, determined to produce respective 12-bit companion patterns that satisfy the condition:

$$|RDS_f| + |RDSc| \leq 10$$

where the subscripts f and c denote the first and companion 12-bit patterns, respectively. The condition, referred to herein as the "companion RDS constraint," ensures that at least one of the first and second code words has an |RDS|≦200. This is an improvement over a code that uses only the three conditions to produce the 12-bit patterns, since such a code word may have run lengths of 16 for transitions and/or no transitions if, for example, consecutive 12-bit patterns in the code word have 8 trailing bits and 8 leading bits that have the same transition or no transition runs. Such code words may then have |RDS| values that are higher than the ($\frac{1}{2}$)*(m*t).

Figure 2:
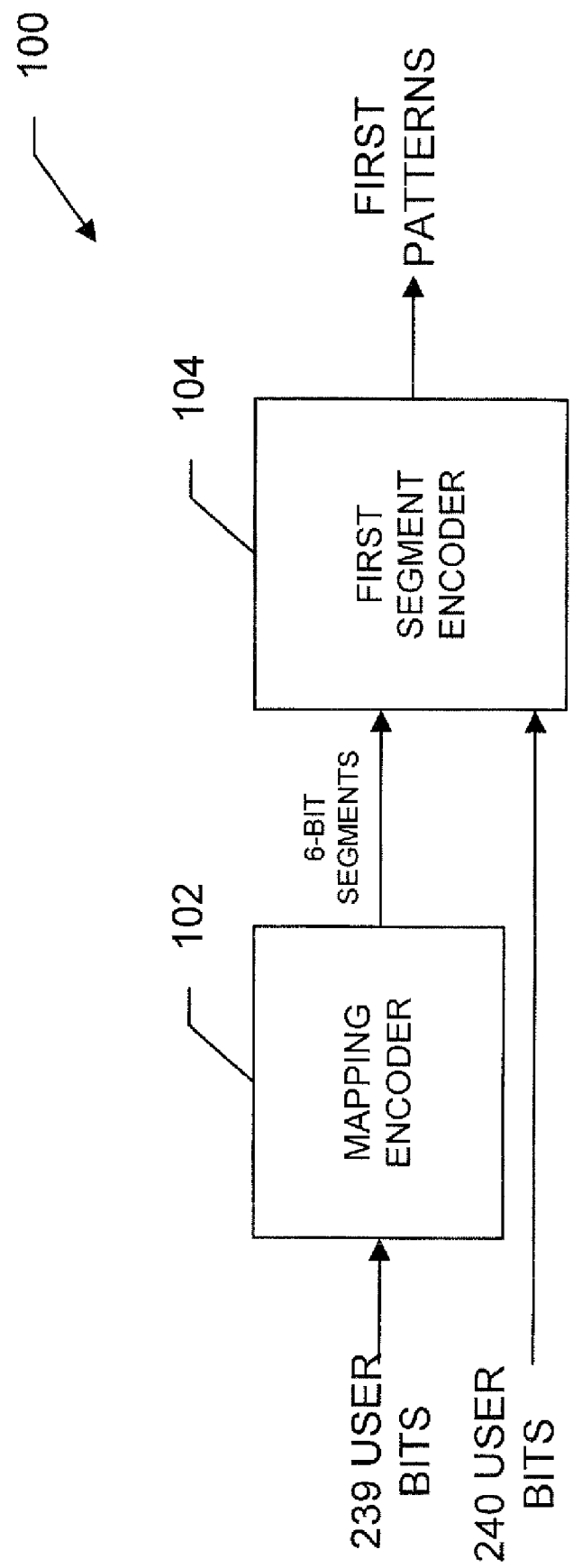
FIG. 2 is a functional block diagram of a first encoder included in the system of FIG. 1.

The encoding is now described in more detail. Referring to FIG. 2, the first encoder 100 consists of a mapping encoder 102 and a segment encoder 104. The mapping encoder 102 maps 239 user bits to 240 bits, which are utilized as 40 6-bit constrained segments. The constrained segments satisfy the RLL constraint that no segment may be all ones. The mapping encoder is described in more detail below with reference to FIG. 3.

The segment encoder 104 utilizes the 240 remaining user bits as 40 6-bit data segments. Each 6-bit data segment is concatenated with a corresponding 6-bit constrained segment, to produce 40 12-bit segments. In the example, the segment encoder maps the 40 12-bit segments directly as the 40 12-bit first patterns that form the first N-bit codeword. Alternatively, the segment encoder 104 may further manipulate the 12-bit segments to produce the 12-bit first patterns.

In general, the system generates m $n_1$-bit constrained segments to concatenate with m $n_2$-bit data segments to produce the m n-bit segments, where $n_1+n_2=n$.

Figure 3:
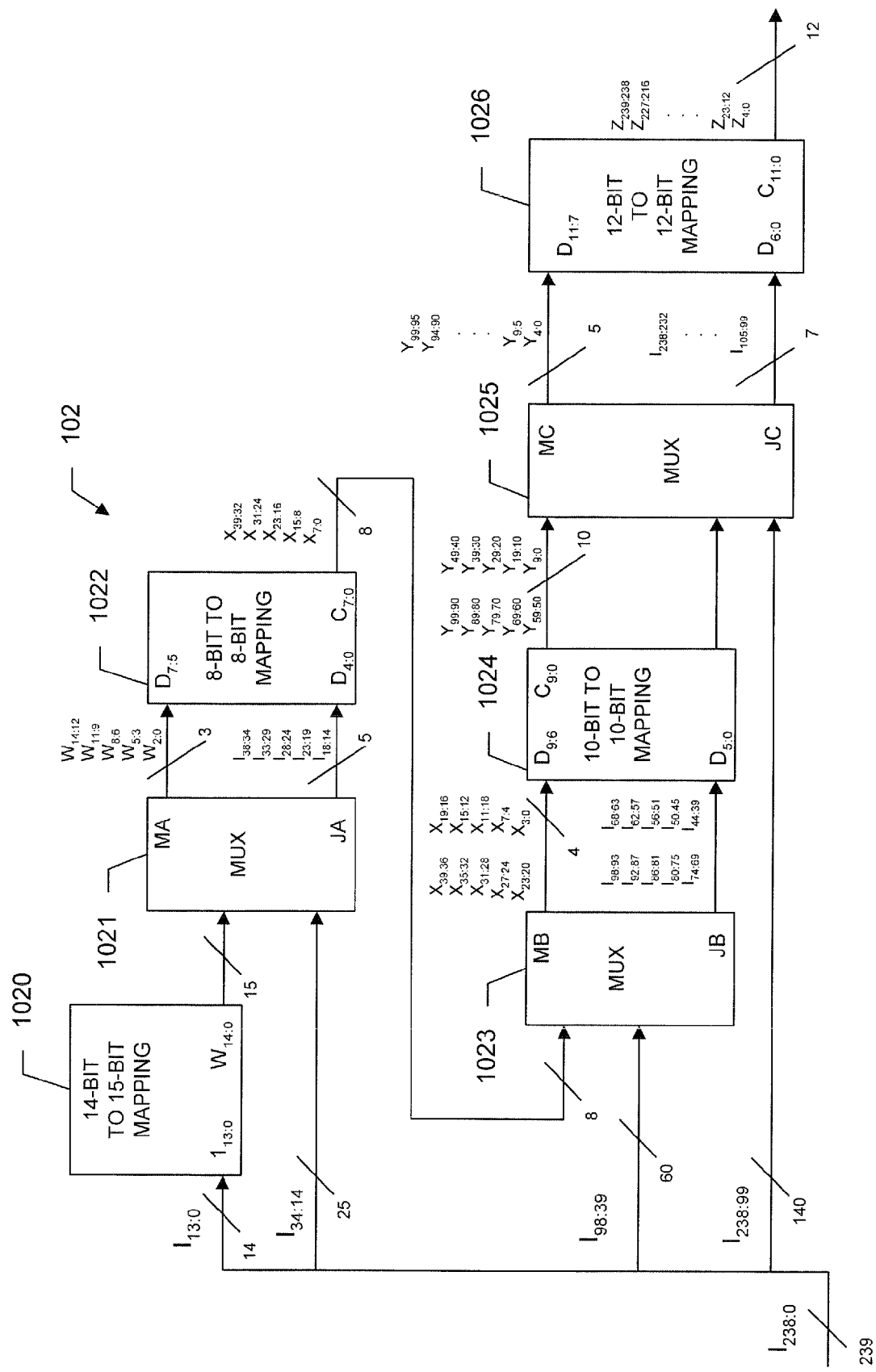
FIG. 3 is a functional block diagram of a mapping encoder included in the encoder of FIG. 2.

Referring now to FIG. 3, the mapping encoder 102 consists of multiple stages. In the example, a first stage 1020 maps the leading 14 input bits into five 3-bit segments that meet the constraint that a segment cannot be all ones. A multiplexer 1021 provides the 3-bit constrained segments produced by the first stage and 25 user bits in groups of five to a second stage 1022. The second stage 1022 mates each of the 3-bit segments with five user bits and maps the eight bits into two 4-bit segments that meet the constraint that a segment cannot be all ones. The second stage produces a total of 10 4-bit constrained segments.

The second stage provides the 4-bit constrained segments through a multiplexer 1023 to a third stage 1024. The multiplexer 1023 also provides to the third stage 60 user bits, which are utilized as 10 6-bit segments. The third stage 1024 mates six user bits with respective 4-bit segments and maps the 10 bits into pairs of 5-bit segments, which meet the constraint that a segment cannot be all ones. The third stage produces a total of 20 5-bit constrained segments. A multiplexer 1025 receives the 20 5-bit constrained segments and 140 user bits, which are to be utilized in segments of 7 bits. The multiplexer provides respective 7-bit segments and 5-bit constrained segments to a fourth stage 1026, which performs a 12-bit to 12-bit mapping, to produce 20 pairs of 6-bit constrained segments. Each 6-bit segment meets the constraint that the segment cannot be all ones and further meets conditions that ensure that the segment can be combined with 6-bit unconstrained user bit segments to produce 12-bit segments that meet the three constraints set forth above.

The 40 6-bit constrained segments are supplied to the segment encoder 104 (FIG. 2), which mates them with respective 6-bit segments of the remaining 240 user bits, to produce the 12-bit segments, or words. The flag bit is included in the user data and is positioned such that the bit is included in the first 12-bit pattern in the N-bit code word. In the example, the flag bit is the first bit of the 240 user bits to be encoded. The segment encoder then encodes the 12-bit words to produce the 12-bit patterns that form the N-bit first code word. In the example, the segment encoder maps the 12-bit words directly as the 12-bit first patterns.

At the same time the 40 12-bit segments produced by the mapping encoder 102 are utilized in the second encoder 110. However, the flag bit is set to a predetermined state that differs from the state utilized in the first encoder. In the example, the flag bit is set to a one for use in the second encoder.

Figure 4:
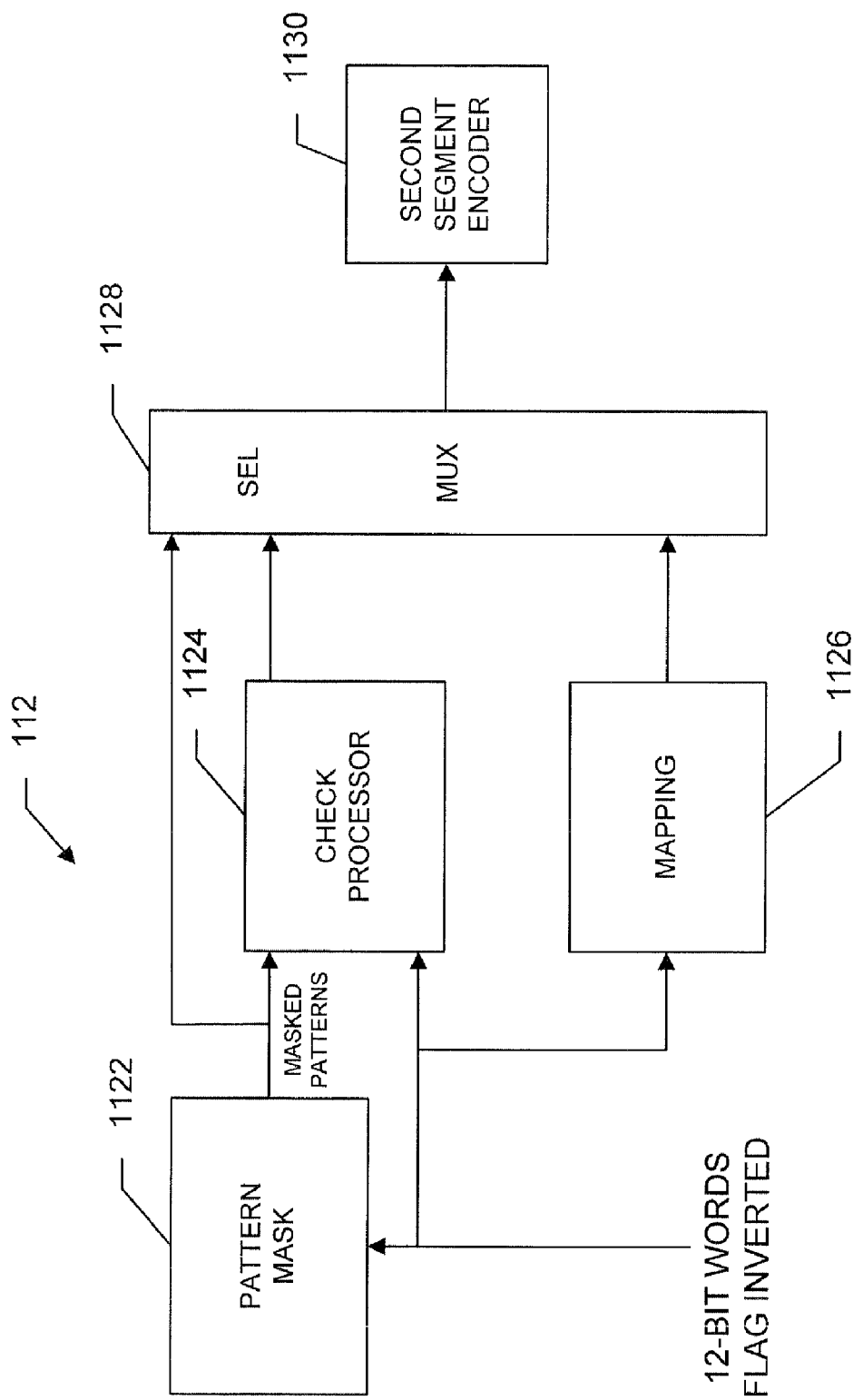
FIG. 4 is a functional block diagram of a second encoder included in the system of FIG. 1.

Referring now to FIG. 4, the second encoder 110 includes the word modifier 112 which modifies the words. The word modifier 112 includes a pattern mask block 1122 that applies a pattern mask to the respective 12-bit words. In the example, the pattern mask block combines a selected term, or as appropriate, one of a number of selected terms, with the respective 12-bit words using an exclusive-OR operation. The pattern mask exclusive-OR's hexadecimal 0xAD6 with all of 12-bit words except words with 101011 as the six most significant bits. A hexadecimal pattern of 0x016 is used for such 12-bit words, to avoid producing a masked word that consists of six 0s at the most significant bits. As is understood by those skilled in the art, for ease of manipulation, the 6 most significant bits of the 12-bit words are inverted before masking, such that the six most significant bits of the masked word are not all 0s. Further, additional masked words may be undesirable and other terms may be applied as pattern masks to avoid them.

A check processor 1124 next manipulates the 40 12-bit masked words and the corresponding 12-bit first patterns (which in the example are the same as 12-bit words) to determine if the masked words meet the companion RDS constraint. If a given masked word meets the constraint, the 12-bit masked word is supplied to a second segment encoder 1130. Otherwise, a different mapping or the manipulation of the 12-bit word is required, and the word is supplied to a mapping block 1126. The mapping block produces a 12-bit mapped word that is the companion of the 12-bit word, that is, a mapped word that meets the companion RDS constraint. A multiplexer 1128 provides the appropriate 12-bit masked words or 12-bit mapped words to the second segment encoder, which produces the 12-bit second patterns. The second encoder operates in the same manner as the first encoder, and maps the words directly as the 12-bit second patterns that form the second code word.

The pattern masks are carefully selected such that all but a small number of masked words are the companions to the corresponding unmasked words. Accordingly, mapping is required for only the small number of words.

FIG. 5 illustrates an alternative embodiment of the encoding system. The mapping encoder 102 operates in the manner described above with reference to FIG. 2 to produce the 6-bit constrained segments. A data modifier 500 is provided 239 data bits and contributes an additional flag bit. The data modifier contributes a flag bit set to a first predetermined state to the user bits that are provided, without further modification, to encoder A. The data modifier contributes a flag bit set to a second predetermined state to the bits that are provided to the word modifier 112. The word modifier operates in the manner described above with reference to FIG. 4, to produce the modified words that are provided to encoder B.

Encoder A includes the first segment encoder 104 (FIG. 2), a transition counter 502 and an RDS counter 504. Encoder B includes the second segment encoder 1130 (FIG. 4), and a transition counter 502 and an RDS counter 504. In the example, the second segment encoder operates in the same manner as the first segment encoder. The transition counters operate in a known manner to count the transitions in the respective N-bit code words. The RDS counters similarly operate in a known manner to produce running digital sums for the N-bit code words. The RDS counts for the first and second code word are supplied to the selector 120, which compares their absolute values to a threshold R to determine if either or both of corresponding |RDS| values exceed the threshold. If so, the selector selects the code word that has the smaller |RDS| value. If both code words have |RDS| values that are below the threshold, the selector selects the code words with the lower transition count.

The parameter R, which acts as the RDS threshold, may be user programmable, such that the decision between the first and second code word may be based more on the |RDS| value than the transition count or vice versa, depending on the environment in which the encoding system is to be used.

As is understood by those skilled in the art, operations performed by the various processors and blocks described above with reference to FIGS. 1-5 may be performed in parallel, to increase the throughput of the system.

FIG. 6 depicts a decoder 600 for use with the current system. The 480 bit code word is provided to a segment decoder that produces corresponding 12-bit segments. The segments are sent to a data modifier 604, which determines if the flag bit contained in the first 12-bit segment is set to a 1 or 0. If the flag bit is set to one, the 40 12-bit segments are modified before further decoding. The modification rule is the same rule used in the encoding, and thus, the bits are XOR'd with an appropriate pattern mask term or they are mapped to an appropriate 12-bit (unmodified) word, in accordance with the operations performed during encoding. If the flag bit is set to zero, the 40 12-bit segments are further decoded as the 12-bit words without modification.

The data modifier 604 next supplies the six least significant bits of respective 12-bit words directly as user data and the six most significant bits as 6-bit constrained segments to a 240-bit to 239-bit decoder 606. The decoder reproduces the 239 user bits from the 240 constrained bits. To do this, the decoder decodes each pair of 6-bit segments into a 5-bit constrained segment and 7 bits of user data. Each pair of the 5-bit segments are further decoded into a 4-bit constrained segment and 6 bits of user data. Next, a pair of 4-bit segments are further decoded into a 3-bit constrained segment and 5 bits of user data. Five 3-bit segments are then decoded by 15-bit to 14-bit decoding to reproduce the final 14 bits of the user data. The decoding, like the encoding, can be performed in 40 clock cycles, with the mapping and constrained segment encoding and decoding steps performed as bit manipulations such as a word inverse operation and/or bitwise OR, AND, XOR and inverse operations.

The decoding of code words in which multiple flags are used is performed in a similar manner, with the decoder using the modification and/or segment decoding steps that correspond to the states of the flags.

Referring now to FIG. 7, we discuss an encoding system that includes a precoder aware RDS encoder 72 that encodes a data block as w-bit sub-blocks to produce w-bit encoded sub-blocks that meet sub-block RDS constraints. The sub-block RDS constraints include the sub-blocks having the same magnitude RDS before and after precoding. The sub-blocks concatenate into a data block that meets block RDS constraints. As is understood by those skilled in the art, the w bit segments encode into sub-blocks in which the bit patterns are determined based on the precoding used in the system. In the example, the precoder is a $$\frac{1}{1 \oplus D}$$

precoder, where D represents a delay and $\oplus$ represents an XOR operation. The XOR operation produces a $-1$ when the input bits are the same and $+1$ when the input bits differ. The example precoder thus produces a bit value, $y_k$, for an input bit $x_k$ as $$y_k = x_k \oplus y_{k-1}$$

where k is a time index. Accordingly, the w bits encode into patterns that have the same magnitude RDS whether precoded by a precoder initially set to a value of $-1$ or a value of $+1$. The encoded sub-blocks concatenate into an RDS encoded data block that meets block RDS constraints. The RDS encoder is discussed in more detail below.

The encoding system further includes a postcoder 74, which translates the data into postcoded data by manipulating the data in a manner that is the inverse of the manipulation that occurs in the precoder. The postcoding of the RDS encoded data ensures that, after precoding, the RDS constraints will be maintained in the corresponding bit stream.

The postcoded data are provided to an error correction code (ECC) encoder 76, in the example an LDPC encoder, which operates in a known manner to produce parity bits. The parity bits are supplied to a parity bit processor 78, which disperses the parity bits as i-bit parity sub-blocks across the encoded data block. The parity bit processor places a parity sub-block between selected data sub-blocks, as depicted in FIG. 8.

The data consisting of the encoded data sub-blocks with inserted parity bits are supplied as a data code word to the precoder 80 which, in a known manner, manipulates the code word bits to produce a precoded bit sequence. The precoder then supplies the bit sequence to a channel for transmission.

Our system thus produces a data code word that after manipulation by the precoder results in a corresponding precoder bit stream that meets a block RDS constraint, since each precoded sub-block meets the sub-block RDS constraints even if a sign inversion occurs during precoding. In the example, the block RDS constraint is a maximum/minimum magnitude of $\pm 8$, which is met with the sub-blocks constrained to $|RDS| \leq 8$. By further constraining the sub-block maximum and minimum magnitudes, the system produces data blocks that meet other RDS constraints. The system may, for example, RDS encode the sub-blocks to meet sub-block RDS constraints of a maximum of $-6$ and a minimum of $+8$, to produce a data block with $|RDS| \leq 6$, by alternating the polarity of sub-blocks with RDS values of $+8$ such that the contributions of these sub-blocks zero out of the block RDS.

The RDS precoder aware encoder 72 operates in a similar manner as the encoder 100 described above with reference to FIGS. 2 and 3, without the inclusion of flags. The RDS precoder aware encoder thus encodes the data in segments as described above, to produce 12 bit patterns. The constraints under which the encoder operates are, however, different. Specifically, the RDS precoder aware encoder operates under the following constraints:

The $|RDS|$ of each 12-bit pattern must be less than or equal to 8, which means the RDS of each 12-bit pattern must be one of $-8, -6, -4, -2, 0, 2, 4, 6, 8$; and The $|RDS|$ for the 12-bit pattern remains the same if the pattern is sign inverted. In the example, the system does not include RLL constraints for the data blocks and thus utilizes a 479/480 code. If RLL constraints are included, the applicable RLL constraints are added to the RDS constraints that must be met by the sub-blocks. Since the insertion of the parity sub-blocks may cause the precoder to invert individual sub-blocks, and the inverted sub-blocks continue to satisfy the RDS constraint, the precoded bit stream will satisfy the RDS constraint. As also discussed above, the patterns are selected such that the $|RDS|$ is the same before and after precoding. In the example, precoding may cause a sign inversion, and thus, the $|RDS|$ constraint is based on sign inversion. Other precoders may result in other manipulations, and the patterns are selected accordingly.

Referring now to FIG. 9, the decoder that is used with the system of FIG. 7 includes a SOVA detector 92, an LDPC decoder 96, the precoder 80 and an RDS decoder 98 that reproduces the user data by reversing the RDS precoder aware encoding of RDS precoder aware encoder 72. The RDS decoder thus operates in the same manner as the RDS decoder 600 described above with reference to FIG. 6, without modification of the bits.

The foregoing description has been directed to specific embodiments. It will be apparent, however, that other variations and modifications may be made to the described embodiments, with the attainment of some or all of their advantages. For example, the ECC encoder that produces the parity bits may utilize iterative or non-iterative codes, such as, for example, block codes, convolutional codes, turbo codes instead of or in addition to the LDPC code, the processors depicted separately may be combined or a processor depicted individually may consist of several processors, the encoding system may be used with all types of recording systems, communications systems, and so forth. Similarly, the channel detector can be implemented as a SOVA detector, a BCJR detector, or a detector that utilizes other known iterative or non-iterative detection techniques. Further, the respective data sub-blocks need not all have the same numbers of bits across the data block. Accordingly, this description is to be taken only by way of example and not to otherwise limit the scope of the invention. Therefore, it is the object of the appended claims to cover all such variations and modifications as come within the true spirit and scope of the invention.

What is claimed is:

1. A method including the steps of:

encoding a data block as w-bit data sub-blocks into w-bit patterns that meet sub-block running-digital-sum (RDS) constraints and have RDS magnitude , the running-digital-sum encoded data sub-blocks concatenating to produce a running-digital-sum encoded data block that satisfies block running-digital-sum constraints;

further encoding the running-digital-sum encoded data block in accordance with an error correction code to produce parity bits;

dispersing the parity bits as i-bit parity sub-blocks between selected running-digital-sum encoded data sub-blocks to produce a data code word; precoding the data code word to produce a precoded bit stream of precoded data sub-blocks for transmission over a channel; and wherein the precoded data sub-blocks meet the sub-block RDS constraints and have the same RDS magnitude as the RDS magnitude of the RDS encoded data sub-blocks.

2. The method of claim 1 further including decoding the precoded bit stream to reproduce the running digital sum encoded data sub-blocks and the parity sub-blocks, removing the parity sub-blocks, and decoding the running digital sum encoded data sub-blocks to reproduce the data block.

3. The method of claim 2 including before the encoding to produce the parity bits, postcoding the running-digital-sum encoded data sub-blocks; and during decoding precoding the running-digital-sum encoded data sub-blocks after the parity sub-blocks are removed.

4. The method of claim 1 further including in the step of further encoding, encoding the running-digital-sum encoded data block in accordance with a low density parity check code, and decoding the encoded bit stream by reproducing the running-digital-sum encoded data sub-blocks and parity sub-blocks, assigning soft information to detected bits, and decoding the bits in accordance with the low density parity check code.

5. The method of claim 1 wherein the precoding is $$\frac{1}{1 \oplus D}$$

where D represents a delay and $\oplus$ is an XOR operation, and the sub-block running-digital-sum constraints include respective blocks having the same magnitude before and after sign inversion.

6. A system including:

a running digital sum encoder that encodes a data block as w-bit sub-blocks to meet sub-block running-digital-sum (RDS) constraints that include encoded w-bit patterns having RDS magnitude;

an error correction code encoder that encodes the running-digital-sum encoded data sub-blocks in accordance with an error correction code to produce parity bits;

a parity bit processor that disperses the parity bits by inserting i-bit parity sub-blocks between selected running-digital-sum encoded data sub-blocks;

a precoder that precodes the running-digital-sum data sub-blocks and parity sub-blocks to produce a precoded bit stream of precoded data sub-blocks for transmission over a channel; and wherein the precoded data sub-blocks meet the sub-block RDS constraints and have the same RDS magnitude as the RDS magnitude of the RDS encoded data sub-blocks.

7. The system of claim 6 wherein the running-digital-sum encoded data sub-blocks concatenate to produce a running-digital-sum encoded data block that satisfies block running-digital-sum constraints.

8. The system of claim 6 further including a decoder that decodes the precoded bit stream to reproduce the running-digital-sum encoded data sub-blocks and parity sub-blocks, removes the parity sub-blocks, and decodes the running-digital-sum encoded data sub-blocks to reproduce the data block.

9. The system of claim 8 wherein the system further includes a postcoder that postcodes the running-digital-sum encoded data block before the parity bits are produced, and a precoder that precodes the decoded running-digital-sum encoded data block after the parity bits are removed.

10. The system of claim 6 further including a low density parity check encoder as the error correction encoder, and a decoder that reproduces the running-digital-sum encoded data sub-blocks and parity sub-blocks, by assigning soft information to detected bits, and decoding the soft information in accordance with the low density parity check code to reproduce the running-digital-sum encoded bit patterns.

11. The system of claim 10 wherein the decoder further includes a running-digital-sum decoder that reproduces the data bits by decoding the w-bit running-digital-sum encoded data sub-blocks to data bits.

12. The system of claim 6 wherein the running-digital-sum encoder further encodes the w-bit sub-blocks to meet run length limit constraints.

13. The system of claim 12 wherein the running-digital-sum encoded sub-blocks concatenate to produce a running-digital-sum encoded data block that satisfies block running-digital-sum and run length constraints.

14. A method including the steps of:

encoding a data block as w-bit data sub-blocks into w-bit patterns that meet sub-block run-length-limit (RLL) constraints and running-digital-sum (RDS) constraints and have a magnitude, the encoded data sub-blocks concatenating to produce an encoded data block that satisfies block run-length-limited and running-digital-sum constraints;

further encoding the encoded data block in accordance with an error correction code to produce parity bits;

dispersing the parity bits by inserting i-bit parity sub-blocks between selected encoded data sub-blocks to produce a data code word;

precoding the data code word to produce a precoded bit stream of precoded data sub-blocks for transmission over a channel; and wherein the precoded data sub-blocks meet the sub-block RLL and RDS constraints and have the same RDS magnitude of the RDS encoded data sub-blocks.

15. The method of claim 14 further including
decoding the precoded bit stream to reproduce the encoded data sub-blocks and the parity sub-blocks,
removing the parity sub-blocks, and
decoding the encoded data sub-blocks to reproduce the data block.

16. The method of claim 15 including
before the encoding to produce the parity bits, postcoding the encoded data sub-blocks; and
during decoding precoding the encoded data sub-blocks after the parity sub-blocks are removed.

17. The method of claim 14 further including
in the step of further encoding, encoding the encoded data block in accordance with a low density parity check code, and
decoding the encoded bit stream by reproducing the encoded data sub-blocks and parity sub-blocks, assigning soft information to detected bits, and decoding the bits in accordance with the low density parity check code.

18. The method of claim 14 wherein
the precoding is $$\frac{1}{1 \oplus D}$$

where D represents a delay and $\oplus$ is an XOR operation, and the sub-block running-digital-sum constraints include respective blocks having the same magnitude before and after sign inversion.

* * * * *